United States Patent
Awaji et al.

(10) Patent No.: US 7,707,484 B2
(45) Date of Patent: *Apr. 27, 2010

(54) TEST APPARATUS AND TEST METHOD WITH FEATURES OF ADJUSTING PHASE DIFFERENCE BETWEEN DATA AND REFERENCE CLOCK AND ACQUIRING ADJUSTED DATA

(75) Inventors: Toshiaki Awaji, Tokyo (JP); Takashi Sekino, Tokyo (JP); Takayuki Nakamura, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/388,802

(22) Filed: Feb. 19, 2009

(65) Prior Publication Data
US 2009/0158103 A1    Jun. 18, 2009

Related U.S. Application Data

(63) Continuation of application No. 11/600,676, filed on Nov. 16, 2006, now Pat. No. 7,512,872, and a continuation of application No. PCT/JP2006/309097, filed on May 1, 2006.

(51) Int. Cl.
| | |
|---|---|
| G11B 27/00 | (2006.01) |
| H03M 13/00 | (2006.01) |
| H04L 7/00 | (2006.01) |
| G06F 11/00 | (2006.01) |
| G01R 31/00 | (2006.01) |

(52) U.S. Cl. .................. 714/814; 714/815; 714/724

(58) Field of Classification Search .............. None
See application file for complete search history.

(56) References Cited

U.S. PATENT DOCUMENTS

| 6,263,463 B1 * | 7/2001 | Hashimoto .................. 714/724 |
| 7,075,285 B2 * | 7/2006 | Chin ........................ 324/76.54 |
| 7,363,563 B1 * | 4/2008 | Hissen et al. ............... 714/733 |
| 7,366,966 B2 * | 4/2008 | LeBerge ..................... 714/718 |

\* cited by examiner

*Primary Examiner*—Christine T Tu
(74) *Attorney, Agent, or Firm*—Osha Liang LLP

(57) ABSTRACT

The apparatus includes a first variable delay circuit that delays a data signal from a device under test (DUT) to output a delay data signal; a second variable delay circuit that delays a clock signal to output a first delay clock signal; a first FF that acquires the delay data signal based on a reference clock; a second FF that acquires the first delay clock signal based on the clock; a first delay adjusting section that adjusts a delay amount of at least one of the first and second variable delay circuits so that the first and second FFs acquire the delay data signal and the first delay clock signal when the signals are changed; a third variable delay circuit that delays the clock signal to output a second delay clock signal; a second delay adjusting section that adjusts a delay amount of the third variable delay circuit based on the acquired first delay clock signal of which a phase is adjusted by the first delay adjusting section when the second delay clock is changed, in order to adjust a phase difference between the first and second delay clock signals to a desired phase difference; a deciding section that decides the quality of the data signal from the DUT based on a result obtained by acquiring the delay data signal when the second delay clock signal is changed.

4 Claims, 7 Drawing Sheets

TEST APPARATUS AND TEST METHOD WITH FEATURES OF ADJUSTING PHASE DIFFERENCE BETWEEN DATA AND REFERENCE CLOCK AND ACQUIRING ADJUSTED DATA

CROSS REFERENCE TO RELATED APPLICATION

This is a continuation application of PCT/JP2006/309097 filed on May 1, 2006, the contents of which are incorporated herein by reference.

BACKGROUND

1. Field of the Invention

The present invention relates to a test apparatus and a test method. More particularly, the present invention relates to a test apparatus and a test method for adjusting a delay amount of a clock signal by reason of a test.

2. Related Art

Recently, a semiconductor memory capable of being fast accessed has adopted source synchronous clocking. Such a semiconductor memory personally generates a clock signal synchronized with a data signal in addition to the data signal. An outside device can read the data signal in synchronization with this clock signal to access the semiconductor memory at high speed and effectively.

A conventional test apparatus adjusts a reference clock signal for test so as to synchronize the reference clock signal with the clock signal acquired from the semiconductor memory in order to test such a semiconductor memory. Then, the test apparatus tests whether the data signal can be read based on this adjusted reference clock signal. The test apparatus generates an artificial delay for the reference clock signal by means of a strobe signal, and also tests whether data can be read if the delay is within a reference range.

The data signal generated from the semiconductor memory may have a jitter. When the data signal has a jitter, the clock signal generated from the semiconductor memory may have a similar jitter in many cases. On the other hand, the reference clock signal in the conventional test apparatus is not affected by the jitter produced in the clock signal once the clock signal has been adjusted. For this reason, since a phase difference by the generation of jitter occurs between the reference clock signal and the data signal, this may cause the decrease of the precision of test.

SUMMARY

Therefore, it is an object of some aspects of the present invention to provide a test apparatus and a test method that can solve the foregoing problems. The above and other objects can be achieved by combinations described in the independent claims. The dependent claims define further advantageous and exemplary combinations of the present invention.

That is, according to the first aspect of the present invention, there is provided a test apparatus that tests a device under test. The test apparatus includes: a reference clock generator that generates a reference clock for the test apparatus; a first variable delay circuit that delays a data signal output from the device under test by a designated time to output the delayed signal as a delay data signal; a second variable delay circuit that delays a clock signal showing a timing at which the data signal should be acquired, which is output from the device under test, by a designated time to output the delayed clock signal as a first delay clock signal; a first flip-flop that acquires the delay data signal at a timing based on the reference clock; a second flip-flop that acquires the first delay clock signal at a timing based on the reference clock; a first delay adjusting section that adjust a delay amount of at least one of the first variable delay circuit and the second variable delay circuit so that the first flip-flop and the second flip-flop acquire the delay data signal and the first delay clock signal at a timing at which the signals are changed; a third variable delay circuit that delays the clock signal by a designated time to output the delayed clock signal as a second delay clock signal; a second delay adjusting section that adjusts a delay amount of the third variable delay circuit based on a result obtained by acquiring the first delay clock signal of which a phase is adjusted by the first delay adjusting section at a timing at which the second delay clock signal is changed, in order to adjust a phase difference between the first delay clock signal and the second delay clock signal to a desired phase difference; and a deciding section that decides the good or bad of the signal output from the device under test based on a result obtained by acquiring the delay data signal at a timing at which the second delay clock signal is changed.

Moreover, the test apparatus may further include a first selecting section that selects which of the signal based on the reference clock and the second delay clock signal is supplied to the second flip-flop, the first delay adjusting section may adjust the delay amounts of the first variable delay circuit and the second variable delay circuit in a state that the first selecting section has been set so as to supply the signal based on the reference clock to the second flip-flop, the second delay adjusting section may set a delay amount of the third variable delay circuit in a state that the first selecting section has been set so as to supply the second delay clock signal to the second flip-flop, and the deciding section may decide the good or bad of the signal output from the device under test in a state that the first selecting section has been set so as to supply the second delay clock signal to the second flip-flop.

Moreover, the first delay adjusting section: may make the first flip-flop and the second flip-flop acquire the data signal and the clock signal by multiple times while respectively changing the delay amounts of the first variable delay circuit and the second variable delay circuit; and detect each delay amount of the first variable delay circuit and the second variable delay circuit when the number of times by which values before the data signal and the clock signal are changed are acquired and the number of times by which values after the data signal and the clock signal have been changed are acquired are substantially equal to each other, in order to set the detected delay amounts in the first variable delay circuit and the second variable delay circuit.

Moreover, the second delay adjusting section may adjust the delay amount of the third variable delay circuit so that a change timing of the second delay clock signal is located at a substantially middle point of a High-level period or a Low-level period for the first delay clock signal.

Moreover, the third variable delay circuit may have a variable delay circuit for adjustment for adjusting a phase of the second delay clock signal and a variable delay circuit for strobe for changing a strobe position of the delay data signal by the second delay clock signal, the second delay adjusting section may adjust a delay amount of the variable delay circuit for adjustment in a state that a predetermined delay amount has been set for the variable delay circuit for strobe, in order to adjust a phase difference between the first delay clock signal and the second delay clock signal to a desired phase difference, and the deciding section may decide the good or bad of the signal output from the device under test based on a result obtained by acquiring the delay data signal at a timing at which the second delay clock signal is changed while changing a delay amount of the variable delay circuit for strobe.

Moreover, the test apparatus may further include: a second selecting section that selects either of the data signal or the signal output from the first flip-flop; a third selecting section that selects either of the clock signal or the signal output from the second flip-flop; a third flip-flop that acquires the signal output from the second selecting section at a timing based on the reference clock; and a fourth flip-flop that acquires the signal output from the third selecting section at a timing based on the reference clock, and the deciding section: may decide, when testing the device under test for outputting the data signal and the clock signal, the good or bad of the signal output from the device under test based on a result obtained by comparing an expected value and a signal value output from the third flip-flop in response to making the second selecting section select the signal output from the first flip-flop; and decide, when testing another device under test for outputting a first data signal and a second data signal in place of the data signal and the clock signal, the good or bad of a signal output from the other device under test based on a result obtained by comparing an expected value and each of signal values output from the third flip-flop and the fourth flip-flop in response to making the second selecting section select the first data signal and making the third selecting section select the second data signal.

According to the second aspect of the present invention, there is provided a test method for testing a device under test. The test method includes: generating a reference clock for a test apparatus; delaying a data signal output from the device under test by a designated time by means of a first variable delay circuit to output the delayed signal as a delay data signal; delaying a clock signal showing a timing at which the data signal should be acquired, which is output from the device under test, by a designated time by means of a second variable delay circuit to output the delayed clock signal as a first delay clock signal; acquiring the delay data signal by means of a first flip-flop at a timing based on the reference clock; acquiring the first delay clock signal by means of a second flip-flop at a timing based on the reference clock; adjusting a delay amount of at least one of the first variable delay circuit and the second variable delay circuit so that the first flip-flop and the second flip-flop acquire the delay data signal and the first delay clock signal at a timing at which the signals are changed; delaying the clock signal by a designated time by means of a third variable delay circuit to output the delayed clock signal as a second delay clock signal; adjusting a delay amount of the third variable delay circuit based on a result obtained by acquiring the first delay clock signal of which a phase is adjusted in the step of adjusting a delay amount of at least one of the first variable delay circuit and the second variable delay circuit at a timing at which the second delay clock signal is changed, in order to adjust a phase difference between the first delay clock signal and the second delay clock signal to a desired phase difference; and deciding the good or bad of the signal output from the device under test based on a result obtained by acquiring the delay data signal at a timing at which the second delay clock signal is changed.

The summary does not necessarily describe all necessary features of the present invention. The present invention may also be a sub-combination of the features described above.

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Figure 1:
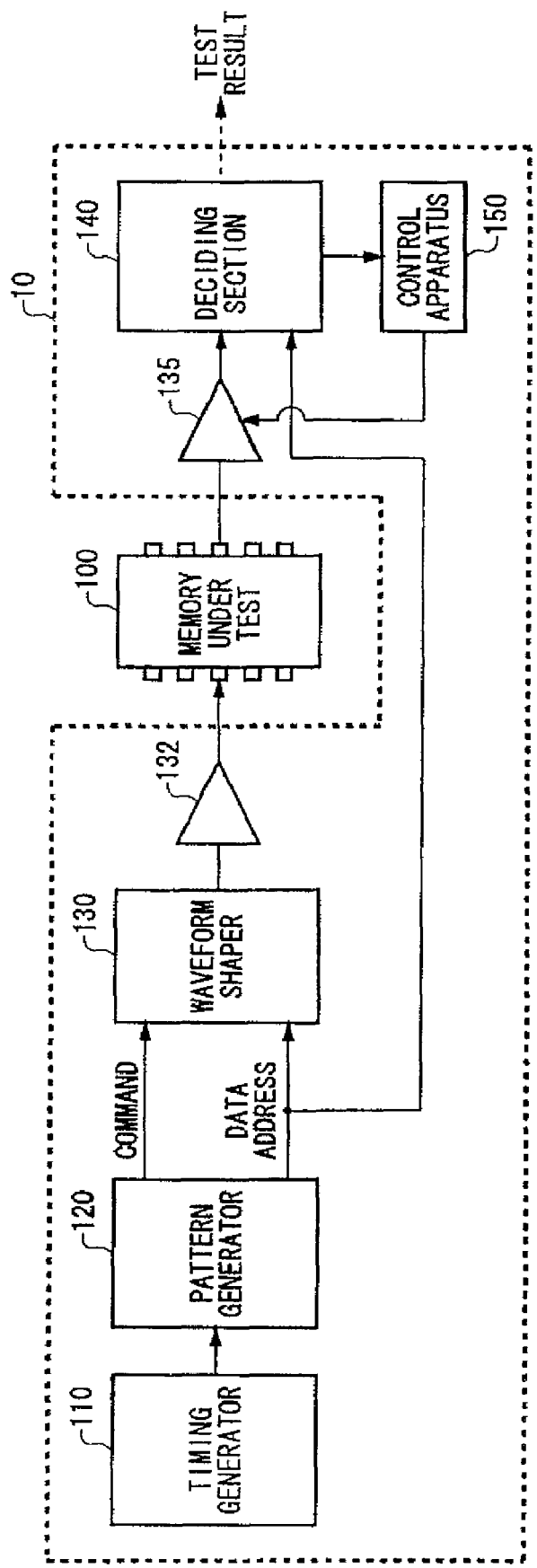
FIG. 1 is a view showing an entire configuration of a test apparatus.

FIG. 1 is a view showing an entire configuration of a test apparatus 10. The test apparatus 10 includes a timing generator 110, a pattern generator 20, a waveform shaper 130, a driver circuit 132, a comparator circuit 135, a deciding section 140, and a control apparatus 150, and tests a device under test 100 that is a semiconductor memory device. The timing generator 110 generates a reference clock such as a cycle clock to supply the generated clock to the pattern generator 120. The pattern generator 120 generates test pattern data to be input into the device under test 100, an address to be input into the device under test 100, and a control command to be input into the device under test 100, based on the cycle clock. Then, the pattern generator 120 outputs these data, address, and command to the waveform shaper 130. Moreover, the pattern generator 120 outputs the test pattern data to the deciding section 140 as expectation data.

The waveform shaper 130 shapes the input test pattern, address, and control command to signal waveforms capable of being input into the device under test 100, in order to supply the shaped waveforms to the device under test 100 via the driver circuit 132. The comparator circuit 135 reads a data signal from the device under test 100. When the device under test 100 adopts source synchronous clocking, the comparator circuit 135 may read a data signal in synchronization with a clock signal supplied from the device under test 100. Then, the deciding section 140 compares data shown by the read data signal with the expectation data input from the pattern generator 120. If the read data are equal to the expectation data, the deciding section 140 outputs a test result of the effect that the device under test 100 is a non-defective unit. The control apparatus 150 performs various types of setting for the comparator circuit 135. Specifically, the control apparatus 150 adjusts a delay amount of a variable delay circuit provided within the comparator circuit 135 in order to make the comparator circuit 135 read a data signal with high precision. Moreover, the control apparatus 150 switches an operation of the comparator circuit 135 according to whether the device under test 100 adopts source synchronous clocking.

Figure 2:
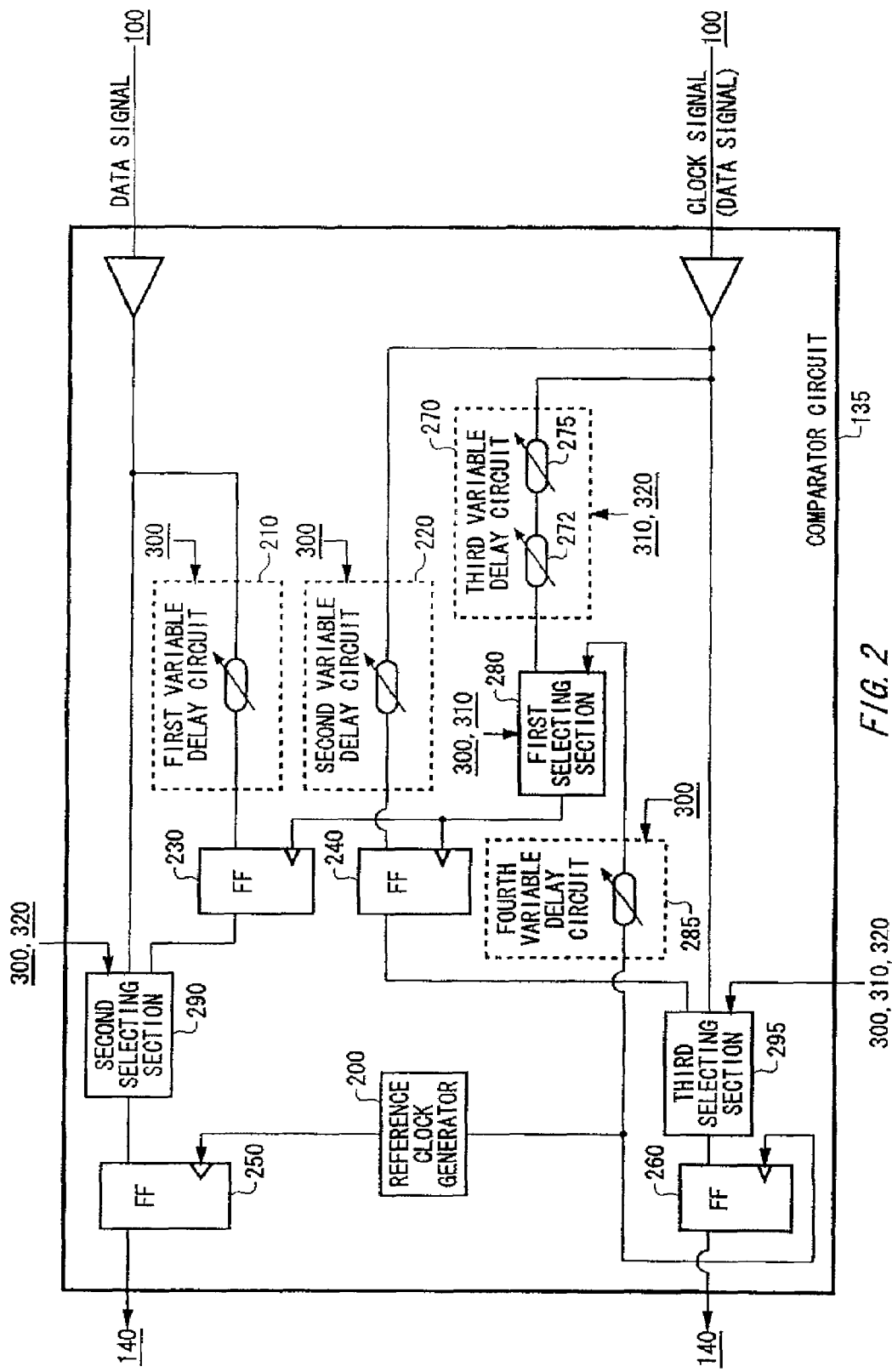
FIG. 2 is a view showing a functional configuration of a comparator circuit.

FIG. 2 is a view showing a functional configuration of the comparator circuit 135. The comparator circuit 135 has a reference clock generator 200, a first variable delay circuit 210, a second variable delay circuit 220, a first flip-flop 230, a second flip-flop 240, a third flip-flop 250, a fourth flip-flop 260, a third variable delay circuit 270, a first selecting section 280, a fourth variable delay circuit 285, a second selecting section 290, and a third selecting section 295. The reference clock generator 200 generates a reference clock for the test apparatus 10. The reference clock generator 200 may supply a reference clock supplied from the timing generator 110 or the like to each section of the comparator circuit 135. The first variable delay circuit 210 delays a data signal output from the device under test 100 by a designated time to output the data signal as a delay data signal. The second variable delay circuit 220 delays a clock signal showing a timing at which the data signal should be acquired, which is output from the device under test 100, by a designated time in order to output the clock signal as a first delay clock signal. Delay amounts of these variable delay circuits are set by a first delay adjusting section 300 to be described below in regard to the description for the control apparatus 150.

The first flip-flop 230 acquires the delay data signal output by the first variable delay circuit 210 at a timing based on the reference clock. A timing acquiring a signal may be later than the reference clock by a delay amount by the fourth variable delay circuit 285. Similarly, the second flip-flop 240 acquires the first delay clock signal output by the second variable delay circuit 220 at a timing based on the reference clock. The second selecting section 290 selects either of the data signal output from the device under test 100 or the delay data signal output by the first flip-flop 230 in order to supply the selected signal to the third flip-flop 250. The third flip-flop 250 acquires the signal output from the second selecting section 290 at a timing based on the reference clock to supply the acquired signal to the deciding section 140. The third selecting section 295 selects either of another data signal output from the device under test 100 and the first delay clock signal output by the third selecting section 295 in order to supply the selected signal to the fourth flip-flop 260. The fourth flip-flop 260 acquires the signal output from the third selecting section 295 at a timing based on the reference clock to supply the acquired signal to the deciding section 140. A setting signal showing which signal is selected in the second selecting section 290 and the third selecting section 295 may be received from the first delay adjusting section 300, a second delay adjusting section 310, and a test control section 320 to be described below.

The third variable delay circuit 270 delays the clock signal output from the device under test 100 by a designated time in order to output the clock signal as a second delay clock signal. For example, the third variable delay circuit 270 may have a variable delay circuit for adjustment 275 for adjusting a phase of the second delay clock signal and a variable delay circuit for strobe 272 for changing a strobe position of the delay data signal by the second delay clock signal. The first selecting section 280 selects which of the signal based on the reference clock and the second delay clock signal is supplied to the second flip-flop 240. The fourth variable delay circuit 285 delays the reference clock by a designated delay amount to supply the delayed clock to the first selecting section 280.

In addition, for clarification of description in FIG. 2, it has been described about when a test based on a single signal is performed on each of data and clock. Alternatively, for a further detailed test, the comparator circuit 135 may generate a first signal of a decision result showing whether a logical value is true and a second signal of a decision result showing whether a logical value is false for each of data and clock. In this case, the first variable delay circuit 210 delays each of the first signal and the second signal for data. Similarly, the second variable delay circuit 220 delays each of the first signal and the second signal for a clock. Moreover, the first flip-flop 230 respectively acquires the first signal and the second signal for data, and the second flip-flop 240 respectively acquires the first signal and the second signal for a clock. According to such a configuration, it is possible to detect a transient state between a true logical value and a false logical value and to broaden the variation of test by the subsequent-stage deciding section 140.

Figure 3:
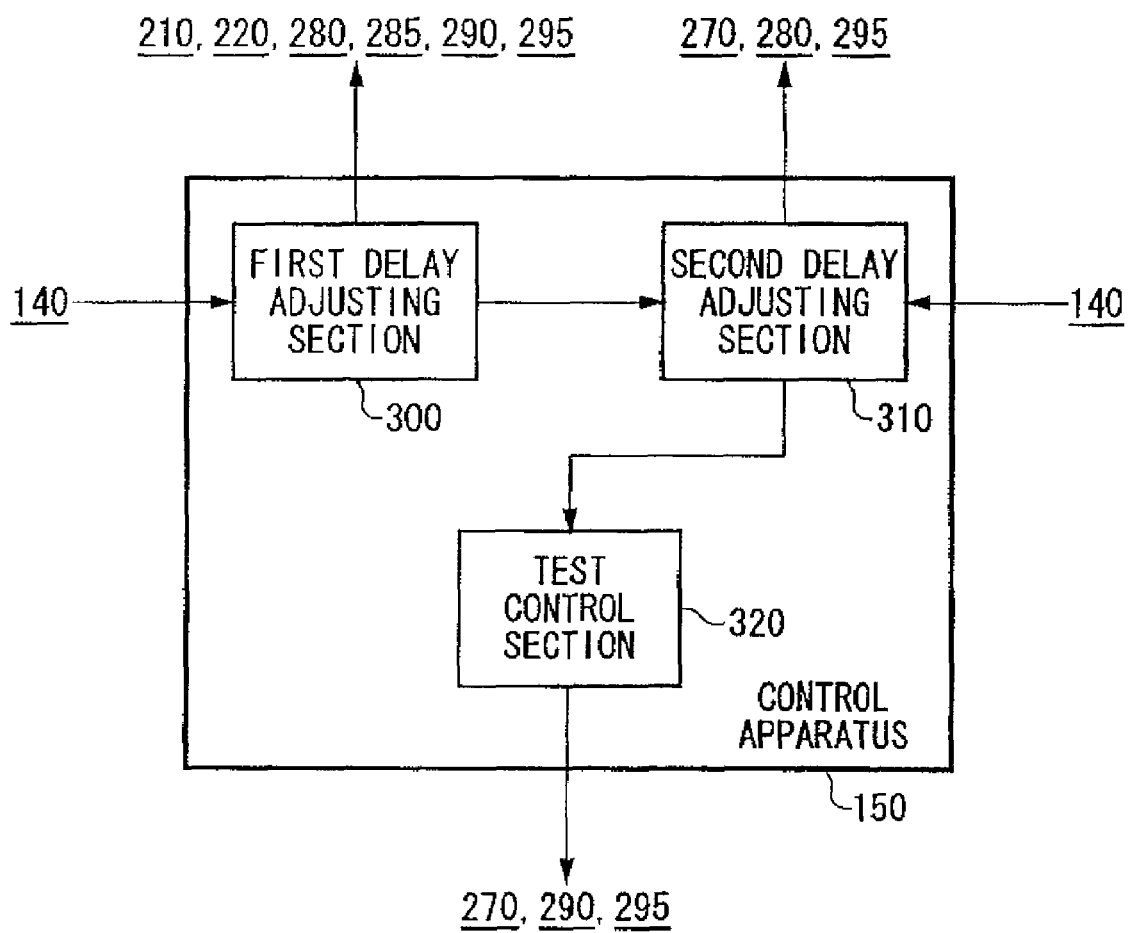
FIG. 3 is a view showing a functional configuration of a control apparatus.

FIG. 3 is a view showing a functional configuration of the control apparatus 150. The control apparatus 150 has the first delay adjusting section 300, the second delay adjusting section 310, and the test control section 320. The first delay adjusting section 300 sets the first selecting section 280 so as to supply the signal based on the reference clock to the second flip-flop 240. Moreover, the first delay adjusting section 300 sets the second selecting section 290 so as to select the signal output from the first flip-flop 230 to supply the selected signal to the third flip-flop 250. Moreover, the first delay adjusting section 300 sets the third selecting section 295 so as to select the signal output from the second flip-flop 240 to supply the selected signal to the fourth flip-flop 260. In the state set in this manner, the first delay adjusting section 300 adjusts a delay amount of at least one of the first variable delay circuit 210 and the second variable delay circuit 220 so that the first flip-flop 230 and the second flip-flop 240 acquire the delay data signal and the first delay clock signal at a timing at which the signals are changed.

As a specific example of an adjustment process, the first delay adjusting section 300 first makes the first flip-flop 230 and the second flip-flop 240 acquire a data signal and a clock signal by multiple times while respectively changing delay amounts of the first variable delay circuit 210 and the second variable delay circuit 220. Then, the first delay adjusting section 300 detects each delay amount of the first variable delay circuit 210 and the second variable delay circuit 220 when the number of times by which values before the data signal and the clock signal are changed are acquired and the number of times by which values after the data signal and the clock signal have been changed are acquired are substantially equal to each other, in order to set the detected delay amounts in the first variable delay circuit 210 and the second variable delay circuit 220. Alternatively, the first delay adjusting section 300 may adjust the delay amount of one side of the first variable delay circuit 210 and the second variable delay circuit 220 and a delay amount of the fourth variable delay circuit 285. That is to say, for example, the first delay adjusting section 300 makes the first flip-flop 230 and the second flip-flop 240 acquire a data signal and a clock signal by multiple times while respectively changing delay amounts of the first variable delay circuit 210 and the fourth variable delay circuit 285. Then, the first delay adjusting section 300 may detect each delay amount of the first variable delay circuit 210 and the fourth variable delay circuit 285 when the number of times by which values before the data signal and the clock signal are changed are acquired and the number of times by which values after the data signal and the clock signal have been changed are acquired are substantially equal to each other, in order to set the detected delay amounts in the first variable delay circuit 210 and the fourth variable delay circuit 285.

The second delay adjusting section 310 receives a notice of the effect that the adjustment of phase has been completed from the first delay adjusting section 300, in order to start an operation. The second delay adjusting section 310 sets the first selecting section 280 so as to supply the second delay clock signal to the second flip-flop 240. Moreover, the second delay adjusting section 310 maintains a state where the second selecting section 290 has been set so as to select the signal output from the first flip-flop 230 to supply the selected signal to the third flip-flop 250. Moreover, the second delay adjusting section 310 maintains a state where the third selecting section 295 has been set so as to select the signal output from the second flip-flop 240 to supply the selected signal to the fourth flip-flop 260. In a state set in this manner, the second delay adjusting section 310 adjusts the delay amount of the third variable delay circuit 270 based on a result obtained by acquiring the first delay clock signal of which a phase is adjusted by the first delay adjusting section 300 at a timing at which the second delay clock signal is changed. Then, the second delay adjusting section 310 adjusts a phase difference between the first delay clock signal and the second delay clock signal to a desired phase difference.

As a concrete process, for example, the second delay adjusting section 310 may adjust a delay amount of the variable delay circuit for adjustment 275 in a state that a predetermined delay amount for the variable delay circuit for strobe 272 has been set, in order to set timings at the first delay clock signal and the second delay clock signal are changed to be substantially equal to each other. When returning a delay by the variable delay circuit for strobe 272 to substantially zero after this setting, it is possible to generate a phase difference corresponding to the delay amount by the variable delay circuit for strobe 272 between the first delay clock signal and the second delay clock signal.

The test control section 320 receives a notice of the effect that the adjustment of phase has been completed from the second delay adjusting section 310, in order to start an operation. The test control section 320 maintains a state where the first selecting section 280 has been set so as to supply the second delay clock signal to the second flip-flop 240. Moreover, the test control section 320 maintains a state where the second selecting section 290 has been set so as to select the signal output from the first flip-flop 230 to supply the selected signal the third flip-flop 250. Moreover, the test control section 320 maintains a state where the third selecting section 295 has been set so as to select the signal output from the second flip-flop 240 to supply the selected signal to the fourth flip-flop 260. In a state set in this manner, the test control section 320 sequentially acquires data signals output from the device under test 100. The test control section 320 may further delay the second delay clock signal by adjusting the delay amount of the variable delay circuit for strobe 272 to perform a timing test for the device under test 100. In this way, although a signal delay within a predetermined reference range occurs, the device under test 100 can be tested about whether a normal operation is possible.

Figure 4:
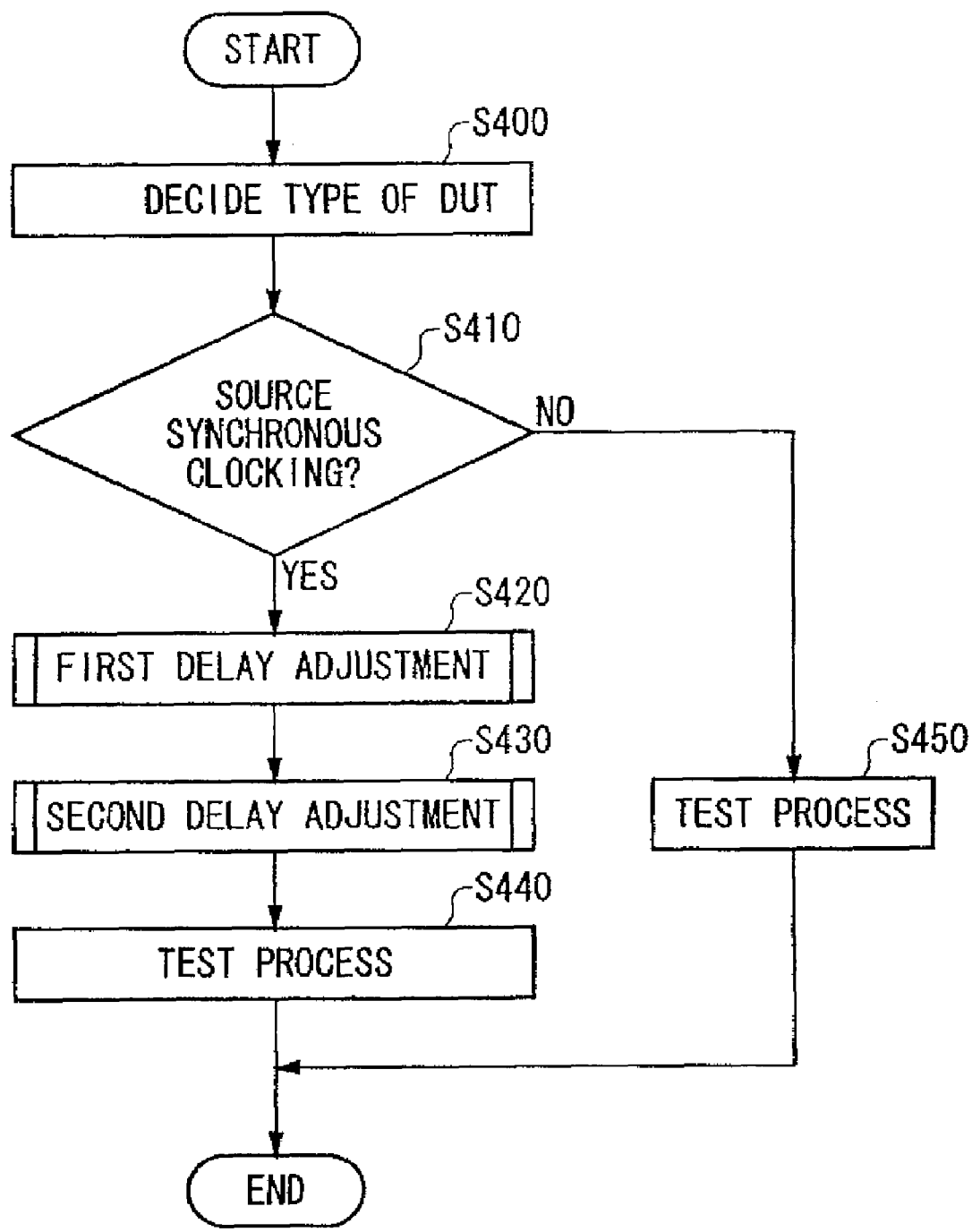
FIG. 4 is a flowchart showing a flow of an adjustment process and a test process prior to a test.

FIG. 4 is a flowchart showing a flow of an adjustment process and a test process prior to a test. First, the test apparatus 10 judges a type of the device under test 100 (S400). The type of the device under test 100 may be previously set in the test apparatus 10 based on the input by an engineer, or may be automatically judged by the test apparatus 10 according to an identification signal or the like output from the device under test 100. On condition that the device under test 100 adopts source synchronous clocking (S410: YES), the first delay adjusting section 300 performs a first delay adjustment (S420). The first variable delay circuit 210 and the second variable delay circuit 220 are adjusted by the first delay adjustment so that the first flip-flop 230 and the second flip-flop 240 acquire the delay data signal and the first delay clock signal at a timing at which the signals are changed.

Next, the second delay adjusting section 310 performs a second delay adjustment (S430). The third variable delay circuit 270 is adjusted by the second delay adjustment so that a phase difference between the first delay clock signal and the second delay clock signal is a desired phase difference. Specifically, the second delay adjusting section 310 may adjust a delay amount of the third variable delay circuit 270 so that a change timing of the second delay clock signal is located at a generally middle point of a High-level period or a Low-level period of the first delay clock signal. In this way, a phase of the second delay clock signal can be a phase in which a data signal is easiest to be acquired in a state where a delay amount is not set in the variable delay circuit for strobe 272, and a test can be performed for each strobe position using this phase as a standard.

Next, the test control section 320 and the deciding section 140 perform a test process for the device under test 100 (S440). Specifically, the test control section 320 first maintains a state where the first selecting section 280 has been set so as to supply the second delay clock signal to the second flip-flop 240. Moreover, the test control section 320 adjusts a strobe position to various positions by adjusting the delay amount of the variable delay circuit for strobe 272. Then, the deciding section 140 decides the good or bad of the device under test 100 based on a result obtained by acquiring the delay data signal at a timing at which the second delay clock signal is changed while changing the delay amount of the variable delay circuit for strobe 272. Specifically, the deciding section 140 decides the good or bad of the signal output from the device under test 100 based on a result obtained by comparing an expected value and a signal value output from the third flip-flop 250 when a signal output from the first flip-flop 230 has been selected by the second selecting section 290.

On the other hand, when the device under test 100 does not adopt source synchronous clocking, that is, on condition that another device under test that is not the device under test 100 illustrated in FIG. 1 is mounted on the test apparatus 10 (S410: NO), the test control section 320 and the deciding section 140 perform a test process on this device under test (S450). Such a type of device under test outputs a first data signal and a second data signal in place of a data signal and a clock signal. The test control section 320 makes the second selecting section 290 select the first data signal and makes the third selecting section 295 select the second data signal. Then, as a result, the deciding section 140 decides the good or bad of the signal output from the device under test 100 based on a result obtained by comparing an expected value and each of the signal values output from the third flip-flop 250 and the fourth flip-flop 260.

Figure 5:
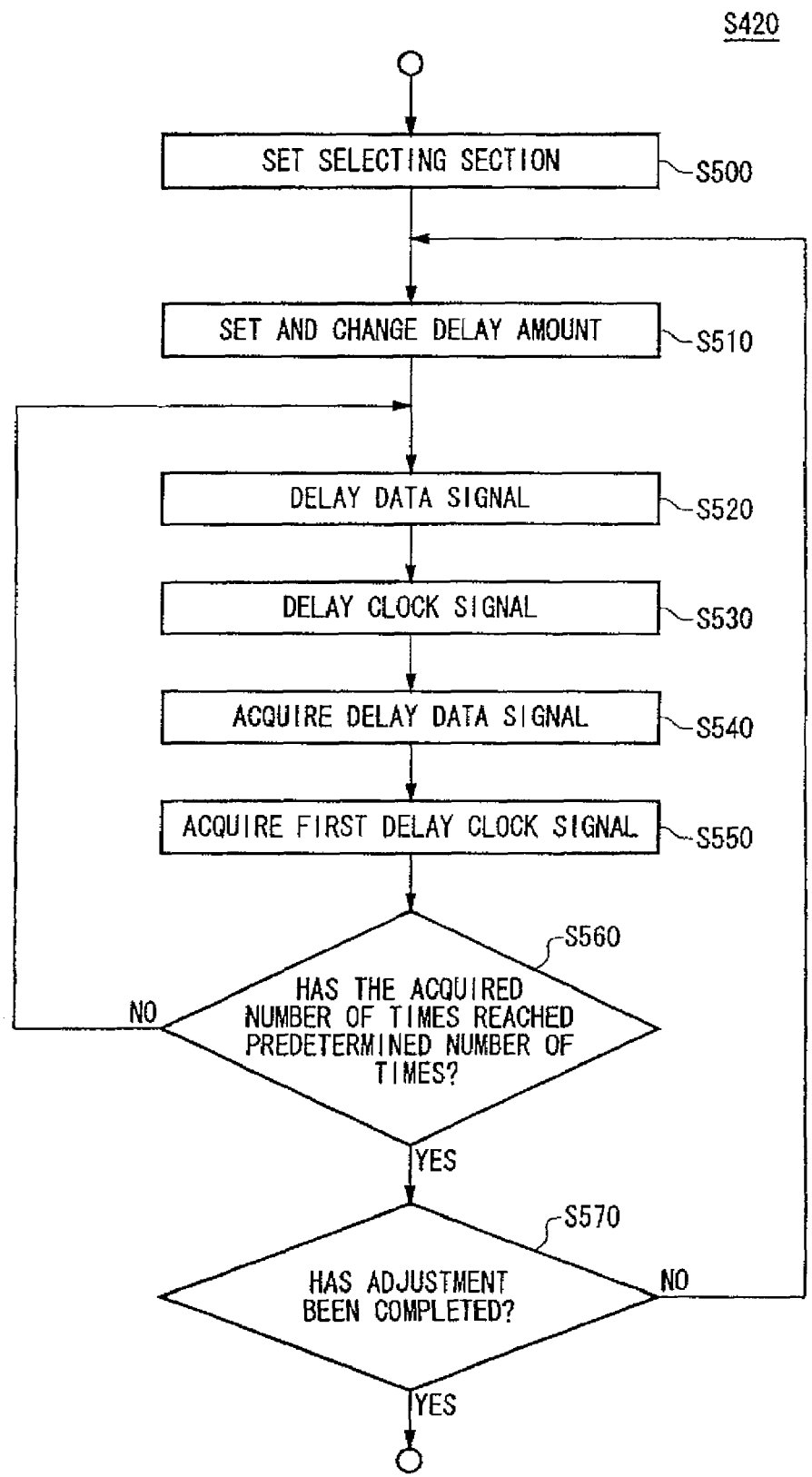
FIG. 5 is a flowchart showing a flow of a process of a first delay adjustment.

FIG. 5 is a flowchart showing a flow of a process for the first delay adjustment. The first delay adjusting section 300 sets the first selecting section 280 so as to supply a signal based on a reference clock to the second flip-flop 240 (S500). Moreover, the first delay adjusting section 300 sets the second selecting section 290 so as to select the signal output from the first flip-flop 230 to supply the selected signal to the third flip-flop 250. Moreover, the first delay adjusting section 300 sets the third selecting section 295 so as to select the signal output from the second flip-flop 240 to supply the selected signal to the fourth flip-flop 260. Next, the first delay adjusting section 300 performs the following process in order to change a delay amount of at least one of the first variable delay circuit 210 and the second variable delay circuit 220.

First, the first delay adjusting section 300 sets a predetermined delay amount in at least one of the first variable delay circuit 210 and the second variable delay circuit 220 (S510). Specifically, the first variable delay circuit 210 delays a data signal output from the device under test 100 by a designated time to output the delayed signal as a delay data signal (S520). Moreover, the second variable delay circuit 220 delays a clock signal showing a timing at which the data signal should be acquired, which is output from the device under test 100, by a designated time in order to output the delayed clock signal as a first delay clock signal (S530). The first flip-flop 230 acquires the delay data signal at a timing based on a reference clock (S540). The second flip-flop 240 acquires the first delay clock signal at a timing based on a reference clock (S550). The above-described processes are repeated until the number of times acquiring the delay data signal and the first delay clock signal reaches a predetermined number of times (S560).

When the number of times acquiring the delay data signal and the first delay clock signal reaches a predetermined number of times (S560: YES), the first delay adjusting section 300 judges whether the phase adjustment for the delay data signal and the first delay clock signal has been completed (S570). For example, the first delay adjusting section 300 may judge that the phase adjustment for the delay data signal and the first delay clock signal has been completed when the number of times by which values before the data signal and the clock signal are changed are acquired and the number of times by which values after the data signal and the clock signal have been changed are acquired are substantially equal to each other. If the phase adjustment is not completed (5570: NO), the first delay adjusting section 300 returns the process to S510 to change the delay amounts of the first variable delay circuit 210 and the second variable delay circuit 220. If the phase adjustment is completed (S570: YES), the process in the present drawing is terminated.

Figure 6:
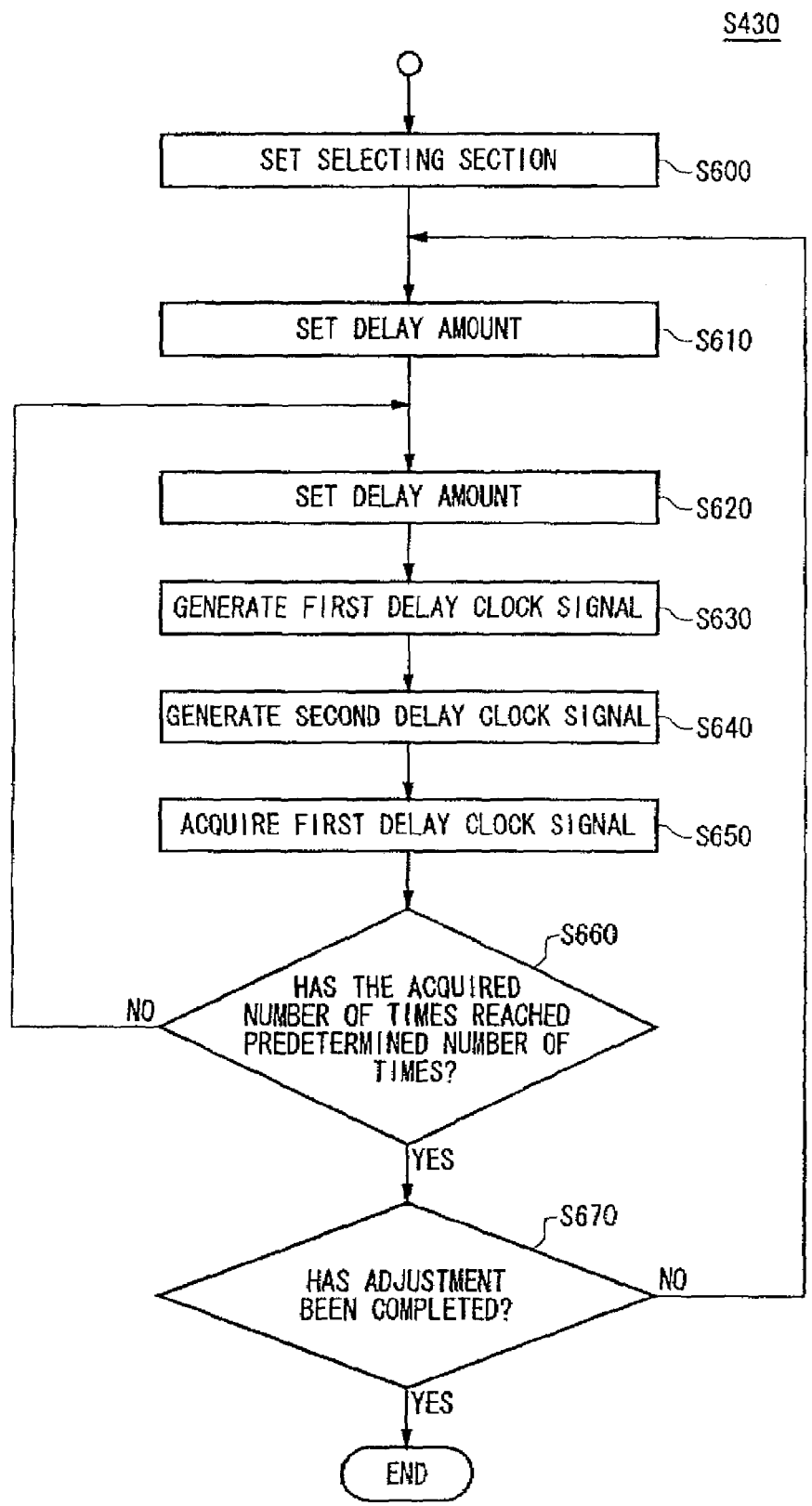
FIG. 6 is a flowchart showing a flow of a process of a second delay adjustment.

FIG. 6 is a flowchart showing a flow of a process for the second delay adjustment. The second delay adjusting section 310 receives a notice of the effect that the adjustment of phase has been completed from the first delay adjusting section 300, and starts the following process. First, the second delay adjusting section 310 sets the first selecting section 280 so as to supply a second delay clock signal to the second flip-flop 240 (S600). Moreover, the second delay adjusting section 310 maintains a state where the second selecting section 290 has been set so as to select the signal output from the first flip-flop 230 to supply the selected signal to the third flip-flop 250. Moreover, the second delay adjusting section 310 maintains a state where third selecting section 295 has been set so as to select the signal output from the second flip-flop 240 to supply the selected signal to the fourth flip-flop 260.

Next, the second delay adjusting section 310 sets a delay amount predetermined for the variable delay circuit for strobe 272 (S610). In this state, the second delay adjusting section 310 performs the following process in order to adjust a delay amount of the variable delay circuit for adjustment 275. First, the second delay adjusting section 310 sets a predetermined delay amount in the variable delay circuit for adjustment 275 (S620). Then, the second variable delay circuit 220 delays a clock signal showing a timing at which a data signal should be acquired, which is output from the device under test 100, by a designated time in order to output the delayed clock signal as a first delay clock signal (S630). Moreover, the third variable delay circuit 270 delays a clock signal by a designated time to output the delayed clock signal as a second delay clock signal (S640). The second flip-flop 240 acquires the first delay clock signal at a timing designated by the second delay clock signal (S650). The above-described processes are repeated until the number of times acquiring the first delay clock signal reaches a predetermined number of times (S660).

When the number of times acquiring the first delay clock signal reaches a predetermined number of times (S660: YES), the second delay adjusting section 310 judges whether the phase adjustment for the second delay clock signal has been completed (S670). For example, the second delay adjusting section 310 may judge that the phase adjustment for the second delay clock signal has been completed when the number of times by which a value before the clock signal is changed is acquired and the number of times by which a value after the clock signal has been changed is acquired are substantially equal to each other. If the phase adjustment is not completed (S670: NO), the second delay adjusting section 310 returns the process to S610 to change a delay amount of the third variable delay circuit 270. If the phase adjustment is completed (S670: YES), the process in the present drawing is terminated.

Figure 7:
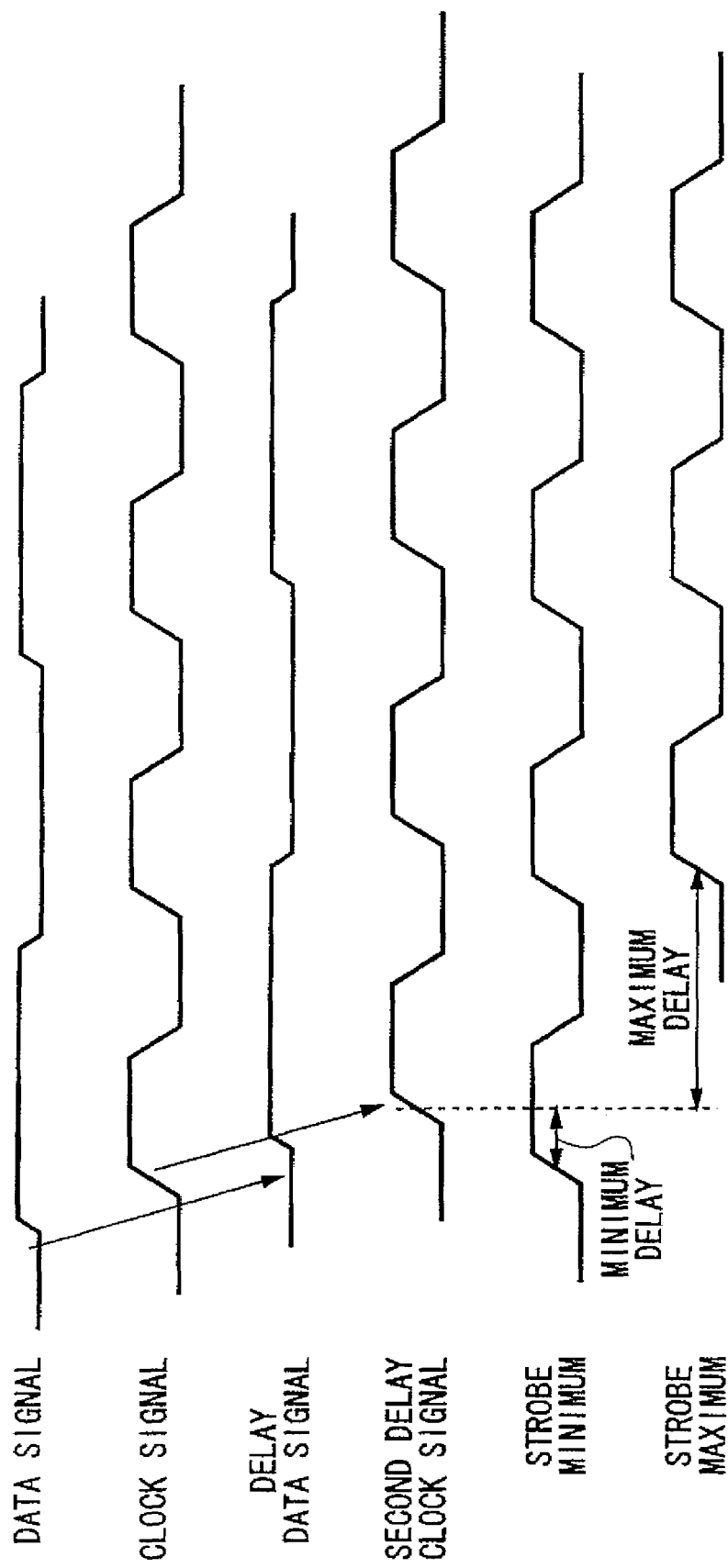
FIG. 7 is a view showing a timing chart for a signal of which a delay amount is adjusted.

FIG. 7 is a view showing a timing chart of a signal of which a delay amount is adjusted. A data signal output from the device under test 100 is delayed by the first variable delay circuit 210 to be output as the delay data signal. On the other hand, a clock signal output from the device under test 100 is delayed by the second variable delay circuit 220 to be output as the first delay clock signal. The second delay clock signal is adjusted by the third variable delay circuit 270 to have a desired phase difference from the first delay clock signal. In this manner, although an output signal from the device under test 100 has a jitter because the second delay clock signal is synchronized with the clock signal, it is possible to maintain the precision of test. Moreover, when a strobe delay is set to a minimum by the variable delay circuit for strobe 272, a variation point of the second delay clock signal becomes fast. When a strobe delay is set to a maximum by the variable delay circuit for strobe 272, a variation point of the second delay clock signal becomes late. In this manner, since a strobe position can be adjusted using the clock signal output from the device under test 100 as a reference, it is possible to raise the precision of quality decision in a timing test for the device under test 100.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to an embodiment of the present invention, it is possible to realize a test apparatus and a test method for deciding the good or bad of an electronic device that adopts source synchronous clocking with high precision.

What is claimed is:

1. A test apparatus for testing a device under test, the device under test outputting a data signal and a clock signal defining a timing of acquiring the data signal, the test apparatus comprising:
a reference clock generator that generates a reference clock for the test apparatus;
a first adjusting section that receives the data signal and the clock signal from the device under test, adjusts a phase difference between the data signal and the reference clock to a preset value and a phase difference between the clock signal and the reference clock to a preset value, and outputs an adjusted data signal and a first adjusted clock signal;

a second adjusting section that receives the clock signal from the device under test, adjusts a phase difference between the received clock signal and the first adjusted clock signal to a preset value, and outputs a second adjusted clock signal; and a first data acquiring section that acquires the adjusted data signal at a timing defined by the second adjusted clock signal.

2. The test apparatus according to claim 1, wherein
the first data acquiring section outputs the acquired data signal at the timing defined by the second adjusted clock signal, and
the test apparatus further comprises:
   a second data acquiring section that acquires the acquired data signal output from the first data acquiring section at a timing defined by the reference clock.

3. The test apparatus according to claim 2, wherein
the second data acquiring section outputs the acquired data signal at the timing defined by the reference clock, and
the test apparatus further comprises:
   a judging section that judges acceptability of at least one of the data signal and the clock signal outputted from the device under test based on the acquired data signal output from the second data acquiring section.

4. A test method for testing a device under test, the device under test outputting a data signal and a clock signal defining a timing of acquiring the data signal, the test method comprising:

generating a reference clock for a test apparatus; receiving the data signal and the clock signal from the device under test, adjusting a phase difference between the data signal and the reference clock to a preset value and a phase difference between the clock signal and the reference clock to a preset value, and outputting an adjusted data signal and a first adjusted clock signal;

receiving the clock signal from the device under test, adjusting a phase difference between the received clock signal and the first adjusted clock signal to a preset value, and outputting a second adjusted clock signal;

acquiring the adjusted data signal at a timing defined by the second adjusted clock signal; and judging acceptability of at least one of the data signal and the clock signal outputted from the device under test based on a result of acquiring the adjusted data signal at a timing defined by the second adjusted clock signal.

* * * * *